United States Patent
Chung (10) Patent No.: US 7,705,419 B2
(45) Date of Patent: Apr. 27, 2010

(54) FUSE BOX OF SEMICONDUCTOR DEVICE FORMED USING CONDUCTIVE OXIDE LAYER AND METHOD FOR FORMING THE SAME

(75) Inventor: Su Ock Chung, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 63 days.

(21) Appl. No.: 11/695,690

(22) Filed: Apr. 3, 2007

(65) Prior Publication Data
US 2008/0023788 A1    Jan. 31, 2008

(30) Foreign Application Priority Data
Jul. 28, 2006    (KR) .................... 10-2006-0071775

(51) Int. Cl.
*H01L 29/00*    (2006.01)
(52) U.S. Cl. .............. 257/529; 257/209; 257/358; 257/359; 257/665; 438/132; 438/601; 438/618
(58) Field of Classification Search .......... 257/529, 257/665, 209, 358–359; 438/601, 132, 618
See application file for complete search history.

(56) References Cited

U.S. PATENT DOCUMENTS 5,679,982 A * 10/1997 Gardner ................. 257/758
6,100,116 A * 8/2000 Lee et al. ................ 438/128
2004/0209384 A1* 10/2004 Hintermaier et al. ........ 438/3
2005/0024910 A1* 2/2005 Kurth et al. ............... 365/94
2005/0224910 A1* 10/2005 Kuno et al. ............... 257/529
2007/0172995 A1* 7/2007 Choi ....................... 438/132

FOREIGN PATENT DOCUMENTS

| JP | 2004-095861 |   | 3/2004 |
|----|-------------|---|--------|
| KR | 2004008455 A | * | 1/2004 |
| KR | 2004059960 A | * | 7/2004 |

* cited by examiner

*Primary Examiner*—David Vu
*Assistant Examiner*—Brandon Fox
(74) *Attorney, Agent, or Firm*—Ladas & Parry LLP

(57) ABSTRACT

A fuse box of a semiconductor device includes a plurality of metal fuses formed on a first interlayer dielectric of a semiconductor substrate and previously removed in blowing regions thereof; a conductive oxidation layer formed to cover removed blowing regions of the metal fuses; a second interlayer dielectric formed on the first interlayer dielectric including the conductive oxide layer; and a plurality of plugs formed in the second interlayer dielectric to be brought into contact with the metal fuses which are removed in the blowing regions thereof.

19 Claims, 8 Drawing Sheets

FUSE BOX OF SEMICONDUCTOR DEVICE FORMED USING CONDUCTIVE OXIDE LAYER AND METHOD FOR FORMING THE SAME

CROSS-REFERENCE TO RELATED APPLICATIONS

The present application claims priority to Korean patent application number 10-2006-0071775 filed on Jul. 29, 2006, which is incorporated herein by reference in its entirety.

BACKGROUND OF THE INVENTION

The present invention relates to a fuse box of a semiconductor device and a method for forming the same, and more particularly, to a fuse box of a semiconductor device that can prevent oxidation of a fuse metal due to external exposure and defects resulting therefrom, and a method for forming the same.

As is generally known in the art, a semiconductor device is manufactured through a fabrication procedure in which cells having integrated circuits are formed on a substrate made of silicon and through an assembly procedure in which the substrate formed with the cells is packaged at the chip level. The chips fabricated through the fabrication procedure undergo, before being packaged, an inspection process in which the electrical characteristics of the cells are inspected.

The inspection process is a process for inspecting whether the cells formed on the substrate are electrically complete or defective. Depending upon the inspection result a chip having defective cells is removed in advance before conducting the assembly procedure in order to conserve labor and assembly costs. Further, the inspection process is also conducted to repair the defective cells.

This repair process will be described below in detail. In general, in the manufacture of a semiconductor device, cells are redundantly formed so as to replace defective cells, and fuses are formed to connect the redundant cells to integrated circuits. The repair process is a process in which the defective cells discovered during the inspection process are connected to the redundant cells additionally formed in a chip using the fuses and are thereby repaired. In the repair process, as a blowing process is conducted, in which a portion of the fuse selected among the fuses formed in the fuse box is cut using a laser, positional information of cells to be repaired is determined.

Hereinbelow, a conventional method for forming a fuse box of a semiconductor device will be described with reference to FIGS. 1A through 1C.

Figure 1A:
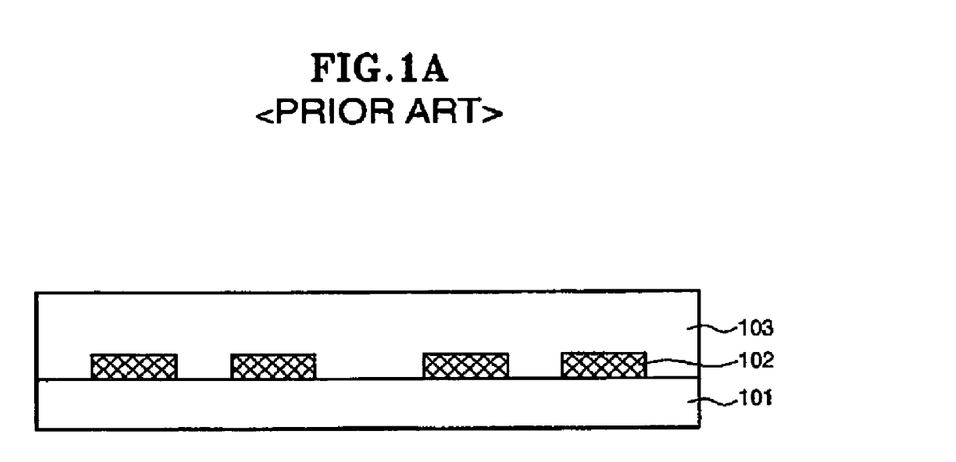
FIGS. 1A through 1C are cross-sectional views illustrating the process steps of a conventional method for forming a fuse box of a semiconductor device.

Referring to FIG. 1A, lower patterns 102 are formed on a semiconductor substrate 101 as an etch stopper of when a plug is formed. A first interlayer dielectric 103 is formed on the semiconductor substrate 101 to cover the lower patterns 102.

Figure 1B:
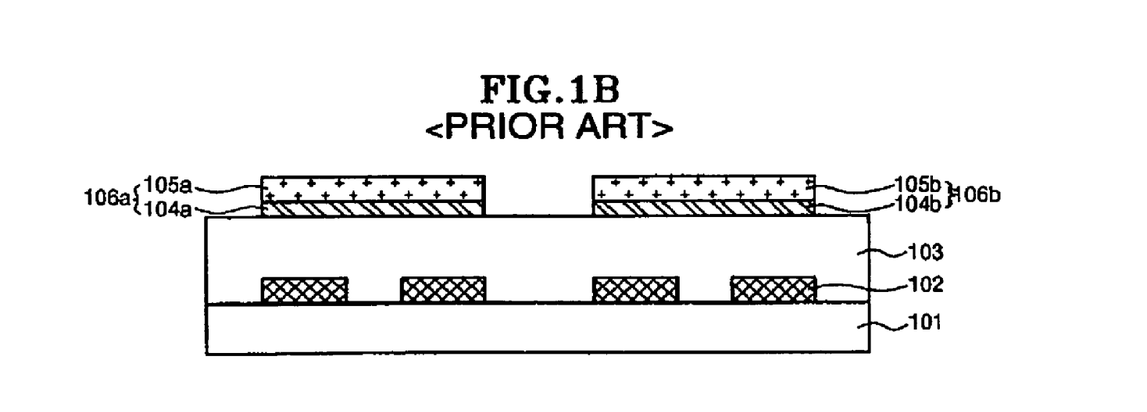

Referring to FIG. 1B, a TiN layer 104a and 104b and a polysilicon layer 105a and 105b are sequentially deposited on the first interlayer dielectric 103. By etching the polysilicon layer 105a and 105b and the TiN layer 104a and 104b, a first metal fuse 106a and a second metal fuse 106b, which comprise stacks of the TiN layer 104a and 104b and the polysilicon layer 105a and 105b, are formed.

Figure 1C:
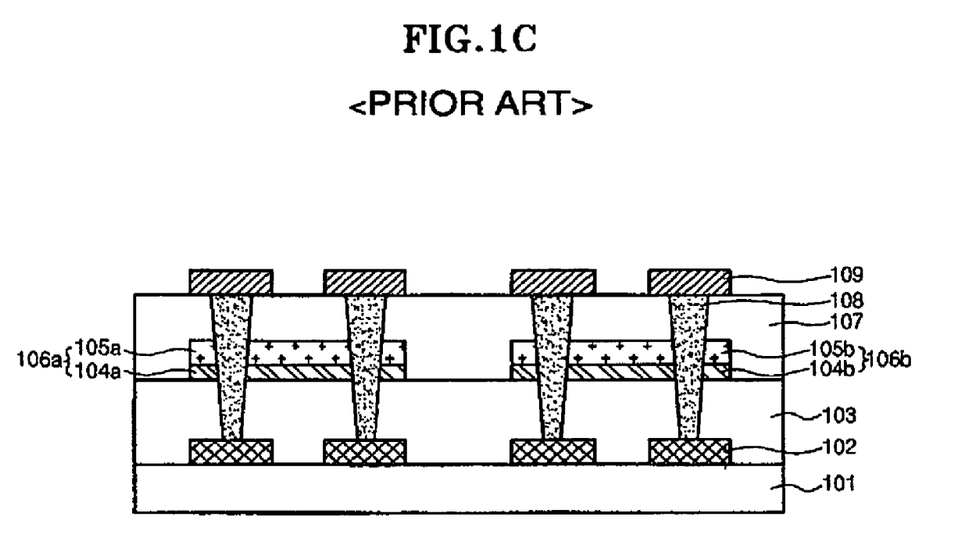

Referring to FIG. 1C, a second interlayer dielectric 107 is formed on the first interlayer dielectric 103 to cover the first and second metal fuses 106a and 106b. Plugs 108 are formed in the second interlayer dielectric 107 and the first interlayer dielectric 103 to pass through the lower patterns 102. At this time, the lower patterns 102 function as an etch stopper of when a plug is formed. Metal lines 109 are formed on the second interlayer dielectric 107 to be brought into contact with the plugs 108, as a result of which the fuse box is completely formed.

After the fuse box is formed in this way, the repair process including the blowing process, in which a portion of the fuse selected between the metal fuses 106a and 106b is cut using a laser, is conducted.

Figure 2A:
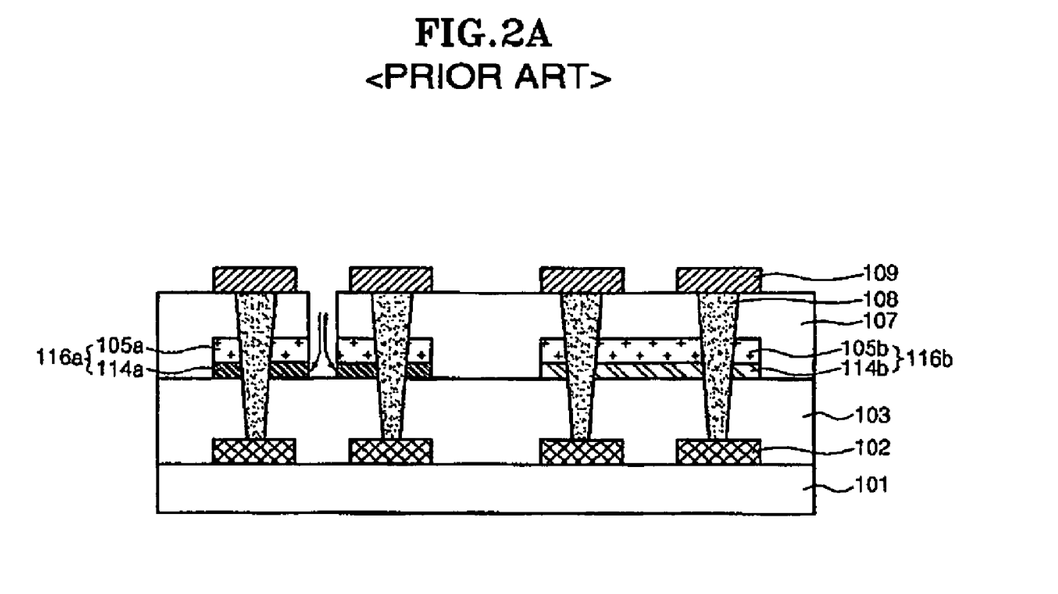
FIGS. 2A and 2B are cross-sectional views explaining the problems of the conventional art.

However, in the construction of the conventional fuse box as described above, as shown in FIG. 2A, after the blowing process for cutting a portion of the certain fuse is conducted, moisture leaks into the portions of the blown metal fuse 116a under the hot and humid conditions in which bias is applied to evaluate the reliability of the semiconductor device. As a consequence, the fuse metal portions, that is, the portions of the TiN layer, exposed to the outside, are oxidated. The reference numeral 114a designates the oxidated TiN layer.

Figure 2B:
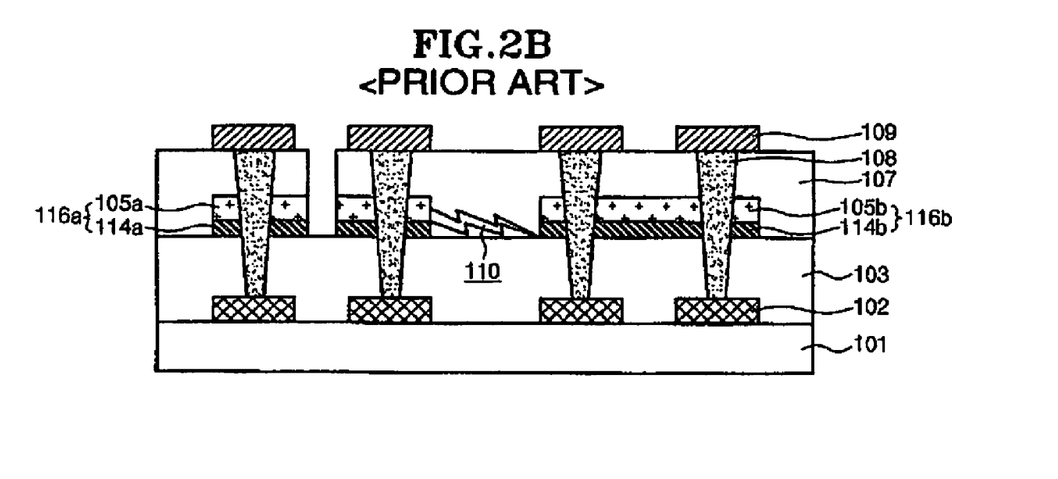

Also, as shown in FIG. 2B, as the volume of the oxidated TiN layer 114a expands, cracks 110 occur at the interface between the first and second interlayer dielectrics 103 and 107. Due to the presence of these cracks, the TiN layer of the adjoining metal fuse 116b that is not blown is likely to be oxidated. The reference numeral 114b designates the oxidated TiN layer of the adjoining metal fuse 116b.

Resultantly, as the TiN layer of the adjoining metal fuse 116b that is not blown is likely to be oxidated, the metal fuse 116b that is not blown can be erroneously recognized as if it is blown, and misoperation of the semiconductor device may be caused, whereby the reliability of the semiconductor device is degraded.

SUMMARY OF THE INVENTION

An embodiment of the present invention is directed to a fuse box of a semiconductor device that can prevent oxidation of a blown fuse metal, and a method for forming the same.

Also, the present invention is directed to a fuse box of a semiconductor device that can prevent oxidation of the blown portion of the fuse metal, thereby improving reliability of the semiconductor device, and a method for forming the same.

In one embodiment, the fuse box of a semiconductor device comprises a plurality of metal fuses formed on the first interlayer dielectric of the semiconductor substrate and previously removed in blowing regions thereof; a conductive oxidation layer formed to cover removed blowing regions of the metal fuses; a second interlayer dielectric formed on the first interlayer dielectric including the conductive oxide layer; and a plurality of plugs formed in the second interlayer dielectric to be respectively brought into contact with remaining portions of the metal fuses that are removed in the blowing regions thereof.

The blowing regions correspond to the portions conductive oxide layer of the metal fuse center portions.

Each metal fuse comprises one metal layer selected from the group consisting of a Ti layer, a TiN layer and an Al layer. The metal layer has a thickness of 10~1,000 Å.

Each metal fuse further comprises a polysilicon layer that is formed on the metal layer.

The conductive oxide layer is formed to cover the entire metal fuses including the removed blowing regions.

The conductive oxide layer comprises a RuOx layer or an IrOx layer. The x has a value of 0.05~0.95.

The conductive oxide layer has a thickness of 10~1,000 Å.

Each plug is formed to pass through each metal fuse.

In another embodiment, a method for forming a fuse box of a semiconductor device comprises the steps of forming a first interlayer dielectric on a semiconductor substrate that is formed with lower patterns; forming a metal layer on the first interlayer dielectric; forming metal fuses previously removed in blowing regions thereof by etching the metal layer; removing the blowing regions of the metal fuses; forming a conductive oxide layer to cover the removed blowing regions of the metal fuses; forming a second interlayer dielectric on the first interlayer dielectric including the conductive oxide layer; and forming a plurality of plugs in the second interlayer dielectric to be respectively connected to remaining portions of the metal fuses that are removed in the blowing regions thereof.

The metal layer is one selected from the group consisting of a Ti layer, a TiN layer and an Al layer. The metal layer is formed to have a thickness of 10~1,000 Å.

The blowing regions correspond to the portions of conductive oxide layer of the metal fuse center portions.

After the step of forming a metal layer and before the step of forming metal fuses, the method further comprises the step of forming a polysilicon layer on the metal layer.

The conductive oxide layer is formed to cover the entire metal fuses including the removed blowing regions.

The conductive oxide layer comprises a RuOx layer or an IrOx layer. The x has a value of 0.05~0.95.

The conductive oxide layer is formed to have a thickness of 10~1,000 Å.

Each plug is formed to pass through each metal fuse.

DESCRIPTION OF SPECIFIC EMBODIMENTS

In the present invention, after the region of a metal fuse, which is to be blown, is removed in advance, a conductive oxide layer such as a RuOx layer or an IrOx layer is formed to fill the removed portion of the metal fuse. Thereupon, a series of well-known subsequent processes for forming a fuse box are sequentially conducted.

By doing this, when the blowing process is conducted, the exposure of only the conductive oxide layer, and not the metal fuse, prevents oxidation of the fuse metal of the metal fuse. Accordingly, in the present invention, since oxidation of the fuse metal can be prevented, volume expansion and occurrence of cracks due to oxidation of the fuse metal can be avoided, and the reliability of a semiconductor device can be improved.

Meanwhile, in the present invention, because a conductive oxide, for example, a RuOx layer or an IrOx layer is used as an oxidation prevention material for preventing oxidation of the fuse metal, the resistance of the metal fuse is not increased, and a stable electrical connection can be established.

Figure 3:
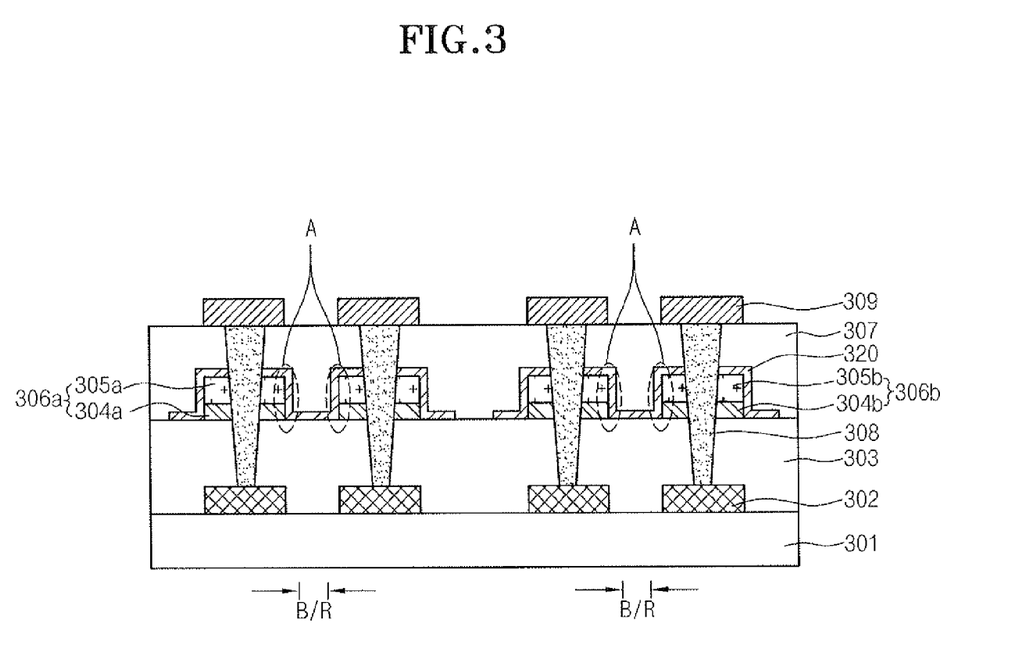
FIG. 3 is a cross-sectional view illustrating a fuse box of a semiconductor device in accordance with an embodiment of the present invention.

Hereafter, the fuse box of a semiconductor device in accordance with an embodiment of the present invention will be described with reference to FIG. 3.

The fuse box according to the present invention includes first and second metal fuses 306a and 306b in which blowing regions B/R corresponding to the center portions thereof are removed, a conductive oxide layer 320 formed to cover the removed portions A, and a plurality of plugs 308 formed to be respectively brought into contact with remaining portions of the first and second metal fuses 306a and 306b.

The first and second metal fuses 306a and 306b are formed on a first interlayer dielectric 303, which is formed on a semiconductor substrate 301. Lower patterns 302 are formed on the semiconductor substrate 301 as an etch stopper of when a plug is formed. The first interlayer dielectric 303 is formed to cover the lower patterns 302.

The fuse box according to an embodiment of the present invention includes a second interlayer dielectric 307, which is formed on the first interlayer dielectric 303 including the conductive oxide layer 320, and metal lines 309, which are formed on the second interlayer dielectric 307 to be connected with the plugs 308.

The first and second metal fuses 306a and 306b comprise stacks of a metal layer 304a and 304b and a polysilicon layer 305a and 305b. The metal layer 304a and 304b comprises a Ti layer, a TiN layer or an Al layer, and is formed to have a thickness of 10~1,000 Å. The conductive oxide layer 320 comprises, for example, a RuOx layer or an IrOx layer, and is formed to have a thickness of 10~1,000 Å. At this time, the x is set to have a value of 0.05~0.95.

Figure 5:
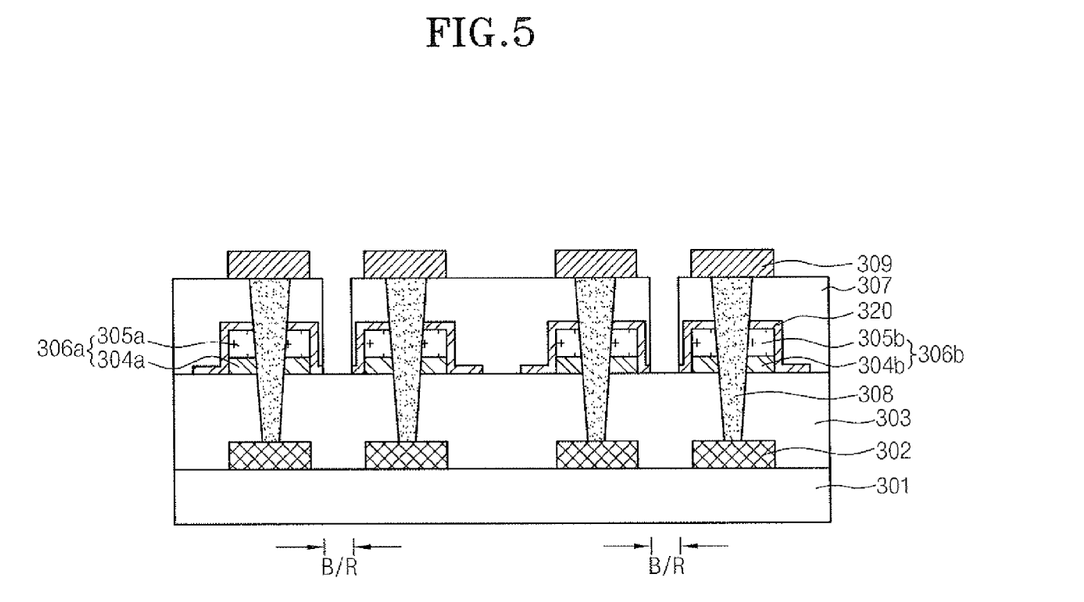
FIG. 5 is a cross-sectional view illustrating a state in which a blowing process is conducted for the fuse box formed according to the present invention.

As can be readily seen from FIG. 5, the conductive oxide layer 320 functions to prevent the metal layer 304a from being oxidated due to leakage of moisture during the blowing process for the first metal fuse 306a. Therefore, volume expansion of the metal layer 304a and occurrence of cracks are prevented. As a consequence, in the present invention, since the metal layer 304b of the second metal fuse 306b, which is not blown, is prevented from being oxidated, it is possible to prevent the second metal fuse 306b from being erroneously recognized as if it is blown, thereby enhancing the reliability of the semiconductor device.

Hereafter, a method for forming a fuse box of a semiconductor device in accordance with another embodiment of the present invention will be described with reference to FIGS. 4A through 4F.

Figure 4A:
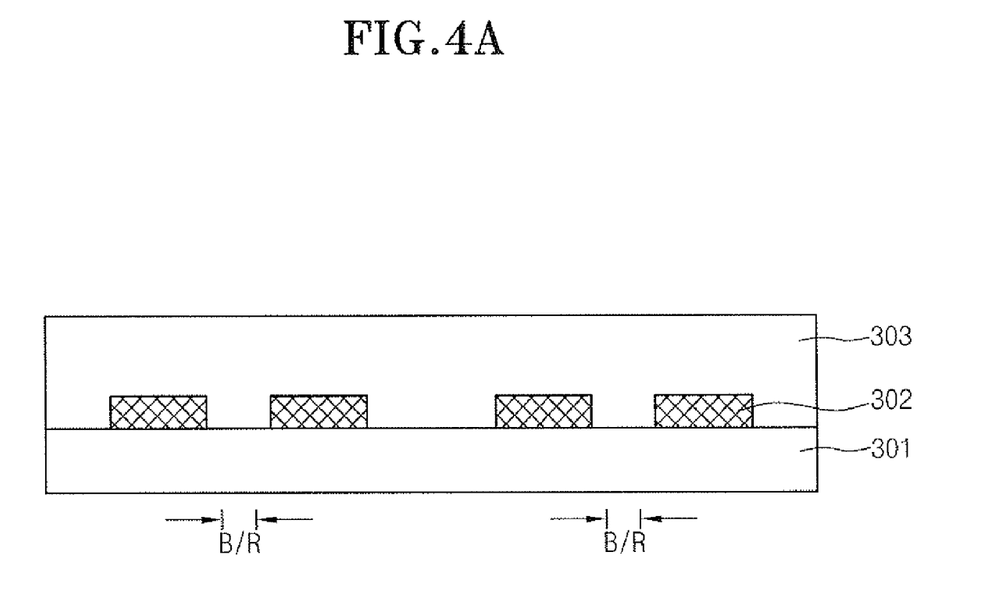
FIGS. 4A through 4F are cross-sectional views illustrating the process steps of a method for forming a fuse box of a semiconductor device in accordance with another embodiment of the present invention.

Referring to FIG. 4A, lower patterns 302 are formed in a fuse forming region of the semiconductor substrate 301 as an etch stopper of when a plug is formed. A first interlayer dielectric 303 is formed on the semiconductor substrate 301 to cover the lower patterns 302.

Figure 4B:
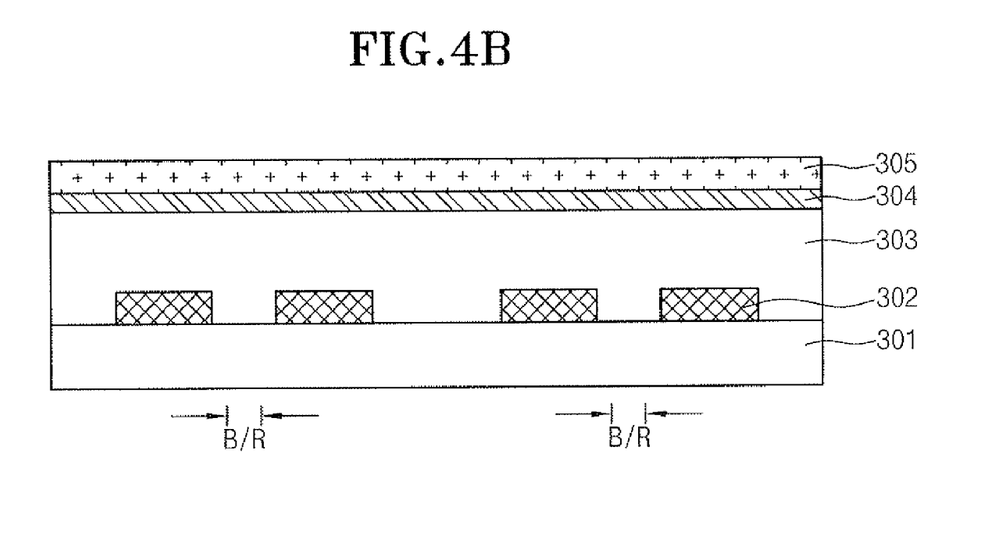

Referring to FIG. 4B, a metal layer 304 and a polysilicon layer 305 are sequentially deposited on the first interlayer dielectric 303. The metal layer 304 is formed using a Ti layer, a TiN layer or an Al layer to have a thickness of 10~1,000 Å.

Figure 4C:
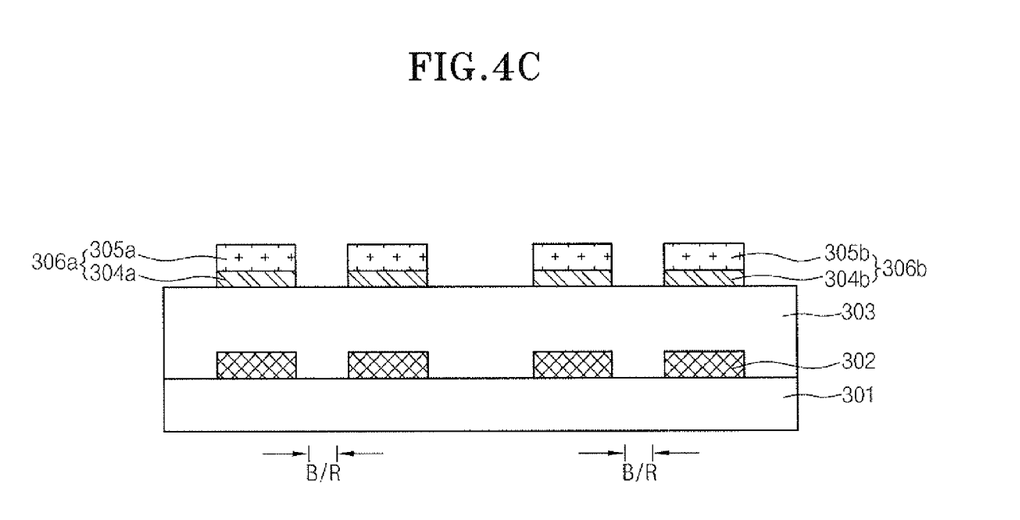

Referring to FIG. 4C, by etching the polysilicon layer 305 and the metal layer 304, first and second metal fuses 306a and 306b are formed to be spaced apart from each other. The first and second metal fuses 306a and 306b comprise stacks of the metal layer 304a and 304b and the polysilicon layer 305a and 305b and are formed to share the single source voltage supply part (not shown). At this time, the first and second metal fuses 306a and 306b have the shape which the portion to be a blowing regions B/R in following is previously removed.

Figure 4D:
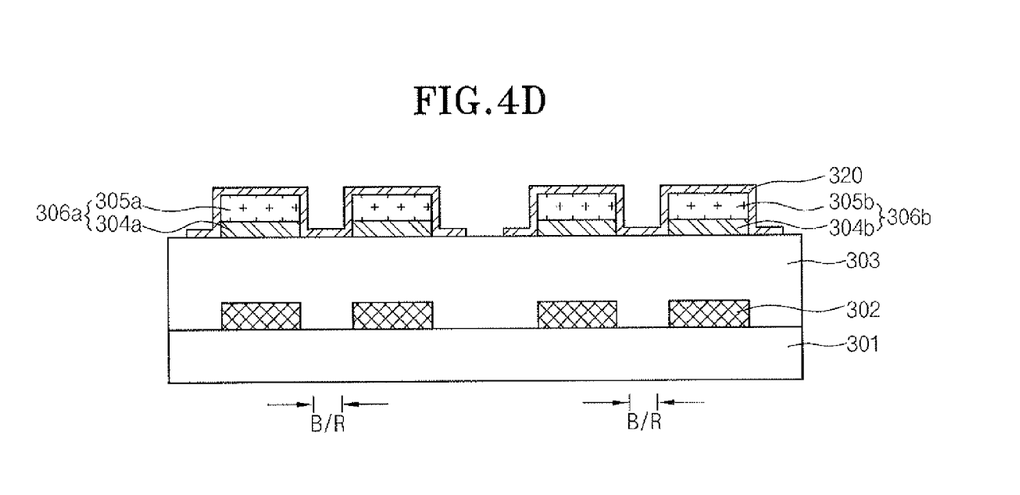

Referring to FIG. 4D, a conductive oxide layer 320 is formed on the first interlayer dielectric 303 to cover the entire first and second metal fuses 306a and 306b including the removed portions. The conductive oxide layer 320 is formed using an oxide material having sufficiently low specific resistances for example, a RuOx layer or an IrOx layer, to have a thickness of 10~1,000 Å. At this time, the x is set to have a value of 0.05~0.95. The conductive oxide layer 320 is etched to cover only the first and second metal fuses 306a and 306b including the removed portions.

The conductive oxide layer 320 functions to connect remaining portions of the first and second metal fuses 306a and 306b to each other. In particular, when subsequently conducting the blowing process, the conductive oxide layer 320 functions to prevent the metal layer 304a and 304b from being oxidated.

Figure 4E:
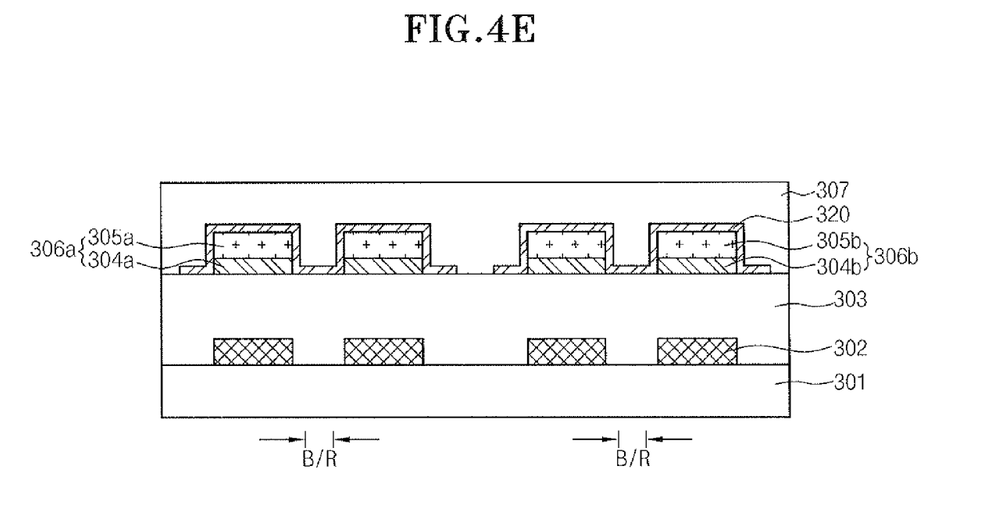

Referring to FIG. 4E, a second interlayer dielectric 307 is formed on the resultant substrate that is formed with the conductive oxide layer 320.

Figure 4F:
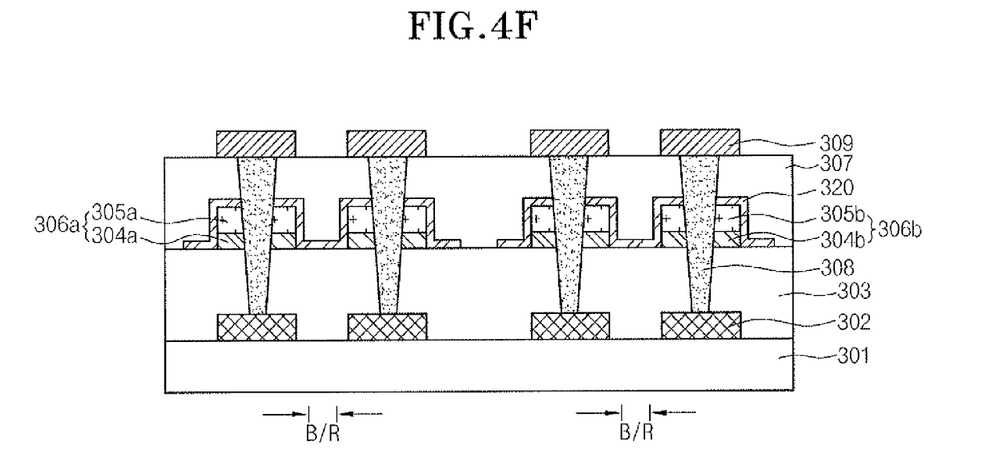

Referring to FIG. 4F, plugs 308 are formed in the second interlayer dielectric 307 and the first interlayer dielectric 303 to pass through the first and second metal fuses 306a and 306b. At this time, the lower patterns 302 function as an etch stopper. Metal lines 309 are formed on the second interlayer dielectric 307 to be brought into contact with the plugs 308, and through this, the fuse box according to the present invention is completely formed.

As is apparent from the above description, in the present invention, after the regions of the first and second metal fuses 306a and 306b, which are to be blown, are removed in advance, the conductive oxide layer 320 is formed in the removed regions. By doing this, as best shown in FIG. 5, when subsequently blowing the first metal fuse 306a, the conductive oxide layer 320 prevents exposure of the metal layer 304a of the first metal fuse 306a.

As a consequence, in the present invention, since it is possible to prevent the metal layer 304a of the first metal fuse 306a from being oxidated due to blowing, volume expansion of the metal layer 304a and the occurrence of cracks due to the volume expansion can be avoided. Therefore, it is possible to prevent occurrence of an error in which an adjoining metal fuse, which is not blown, is recognized to be blown due to the presence of the cracks.

As a result, in the present invention, that the prevention of oxidation of the fuse metal allows for improved reliability of the semiconductor device.

Although specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A fuse box of a semiconductor device, comprising:
a plurality of metal fuses formed on a first interlayer dielectric of a semiconductor substrate, each of the metal fuses including a blowing region and a portion of each of the metal fuses being removed in the blowing region thereof, wherein the blowing region is a region where the metal fuse would be blown and wherein the portion of the metal fuse is removed prior to any blowing of the metal fuse, wherein each metal fuse includes
a conductive oxide layer covering the portion of the metal fuse removed in the blowing region so as to form an electrical connection between remaining portions of the metal fuse prior to any blowing, the conductive oxide layer comprising an RuOx layer or an IrOx layer;
a second interlayer dielectric formed on the first interlayer dielectric including the conductive oxide layer; and
a plurality of plugs formed in the second interlayer dielectric to be respectively brought into contact with remaining portions of the metal fuses that are removed in the blowing regions thereof.

2. The fuse box according to claim 1, wherein the blowing regions are located at center portions of the metal fuses.

3. The fuse box according to claim 1, wherein each metal fuse comprises one metal layer selected from the group consisting of a Ti layer, a TiN layer and an Al layer.

4. The fuse box according to claim 3, wherein the metal layer has a thickness of 10~1,000 Å.

5. The fuse box according to claim 1, wherein each metal fuse further comprises a polysilicon layer that is formed on the metal layer.

6. The fuse box according to claim 1, wherein the conductive oxide layer is formed to cover the metal fuses entirely including the removed blowing regions.

7. The fuse box according to claim 1, wherein the x has a value of 0.05~0.95.

8. The fuse box according to claim 1, wherein the conductive oxide layer has a thickness of 10~1,000 Å.

9. The fuse box according to claim 1, wherein each plug is formed to pass through each metal fuse.

10. A method for forming a fuse box of a semiconductor device, comprising the steps of:
forming a first interlayer dielectric on a semiconductor substrate which is formed with lower patterns;
forming a metal layer on the first interlayer dielectric;
forming metal fuses previously removed in blowing regions thereof by etching the metal layer;
removing the blowing regions of the metal fuses;
forming a conductive oxide layer to cover the removed blowing regions of the metal fuses;
forming a second interlayer dielectric on the first interlayer dielectric including the conductive oxide layer; and
forming a plurality of plugs in the second interlayer dielectric to be respectively connected with remaining portions of the metal fuses which are removed in the blowing regions thereof.

11. The method according to claim 10, wherein the metal layer is one selected from the group consisting of a Ti layer, a TiN layer and an Al layer.

12. The method according to claim 11, wherein the metal layer is formed to have a thickness of 10~1,000 Å.

13. The method according to claim 10, wherein the blowing regions correspond to the portions of conductive oxide layer of the metal fuse center portions.

14. The method according to claim 10, after the step of forming a metal layer and before the step of forming metal fuses, further comprising the step of:
forming a polysilicon layer on the metal layer.

15. The method according to claim 10, wherein the conductive oxide layer is formed to cover the metal fuses entirely including the removed blowing regions.

16. The method according to claim 10, wherein the conductive oxide layer comprises a RuOx layer or an IrOx layer.

17. The method according to claim 16, wherein the x has a value of 0.05~0.95.

18. The method according to claim 10, wherein the conductive oxide layer is formed to have a thickness of 10~1,000 Å.

19. The method according to claim 10, wherein each plug is formed to pass through each metal fuse.

* * * * *